(12) United States Patent
Moriguchi et al.

(10) Patent No.: US 8,610,226 B2
(45) Date of Patent: Dec. 17, 2013

(54) PHOTOSENSOR ELEMENT, PHOTOSENSOR CIRCUIT, THIN-FILM TRANSISTOR SUBSTRATE, AND DISPLAY PANEL

(75) Inventors: Masao Moriguchi, Osaka (JP); Yohsuke Kanzaki, Osaka (JP); Tsuyoshi Inoue, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/519,563

(22) PCT Filed: Nov. 11, 2010

(86) PCT No.: PCT/JP2010/006634
§ 371 (c)(1),
(2), (4) Date: Jul. 19, 2012

(87) PCT Pub. No.: WO2011/080863
PCT Pub. Date: Jul. 7, 2011

(65) Prior Publication Data
US 2012/0292627 A1    Nov. 22, 2012

(30) Foreign Application Priority Data

Dec. 28, 2009  (JP) ................................. 2009-298558

(51) Int. Cl.
*H01L 27/14*    (2006.01)
(52) U.S. Cl.
USPC ..................... 257/431; 257/E29.273; 977/932
(58) Field of Classification Search
CPC .................. H01L 27/14609; H01L 27/14643; H01L 27/14689; B82Y 20/00; B82Y 30/00
USPC .............. 257/53, 59, 290, E29.273, 431, 432, 257/463; 977/902, 932, 853
See application file for complete search history.

(56) References Cited

U.S. PATENT DOCUMENTS

| 5,435,608 | A | * | 7/1995 | Wei et al. | 257/59 |
| 5,461,419 | A | | 10/1995 | Yamada | |
| 5,677,236 | A | * | 10/1997 | Saitoh et al. | 438/485 |
| 5,841,180 | A | * | 11/1998 | Kobayashi et al. | 257/448 |
| 5,976,978 | A | * | 11/1999 | Salisbury | 438/690 |
| 2010/0259699 | A1 | * | 10/2010 | Yen et al. | 349/38 |

FOREIGN PATENT DOCUMENTS

| JP | 6-133224 A | 5/1994 |
| JP | 2004-300530 A | 10/2004 |
| JP | 2005-129909 A | 5/2005 |
| JP | 2009-302192 A | 12/2009 |

* cited by examiner

*Primary Examiner* — Nikolay Yushin
(74) *Attorney, Agent, or Firm* — Chen Yoshimura LLP

(57) ABSTRACT

Disclosed is a photosensor element that is provided with a gate electrode (11*da*) disposed on an insulating substrate (10), a gate insulation film (12) disposed so as to cover the gate electrode (11*da*), a semiconductor layer (15*db*) disposed on the gate insulating film (12) so as to overlap the gate electrode (11*da*), and a source electrode (16*da*) and a drain electrode (16*db*) provided on the semiconductor layer (15*db*) so as to overlap the gate electrode (11*da*) and so as to face each other. The semiconductor layer (15*db*) is provided with an intrinsic semiconductor layer (13*db*) in which a channel region (C) is defined and an extrinsic semiconductor layer (14*db*) that is laminated on the intrinsic semiconductor layer (13*db*) such that the channel region (C) is exposed therefrom. The intrinsic semiconductor layer (13*db*) is an amorphous silicon layer containing nanocrystalline silicon particles.

3 Claims, 8 Drawing Sheets (a)

(b)

(c)

(d)

PHOTOSENSOR ELEMENT, PHOTOSENSOR CIRCUIT, THIN-FILM TRANSISTOR SUBSTRATE, AND DISPLAY PANEL

TECHNICAL FIELD

The present invention relates to a photosensor element, a photosensor circuit, a thin-film transistor substrate, and a display panel, and more particularly, to a photosensor element that detects infrared light by using amorphous silicon, a photosensor circuit, a thin-film transistor substrate, and a display panel.

BACKGROUND ART

A thin-film transistor (hereinafter also referred to as "TFT") using amorphous silicon generates a photocurrent when light enters a semiconductor layer thereof, and therefore, in recent years, a display panel with a touch panel function that uses TFTs not only as switching elements for respective pixels, but also as photosensor elements has been proposed.

Patent Document 1, for example, discloses an optical sensor device in which amorphous silicon photodiodes and amplifiers constituted of the thin-film transistors are integrally formed on a substrate.

RELATED ART DOCUMENTS

Patent Documents
Patent Document 1: Japanese Patent Application Laid-Open Publication No. 2005-129909

SUMMARY OF THE INVENTION

Problems to be Solved by the Invention

In photosensor elements, it is necessary to detect infrared light, for example, without being affected by ambient light so as to prevent an erroneous operation. The bandgap of the amorphous silicon is about 1.8 eV, and because the optical-absorption coefficient thereof significantly drops around 1.8 eV and below, the amorphous silicon absorbs little infrared light. Because of this, in the photosensor elements constituted of the TFTs that use the amorphous silicon, radiation of the infrared light makes little difference in the performance of the TFTs. Therefore, it is difficult for such photosensor elements to achieve a sufficient sensitivity in the near-infrared region (wavelength of 830 nm or more).

The present invention was made in view of such a problem, and an object thereof is to increase the sensitivity to infrared light of the photosensor elements that use the amorphous silicon.

Means for Solving the Problems

In order to achieve the above-mentioned object, in the present invention, an intrinsic semiconductor layer is made of an amorphous silicon layer that contains nanocrystalline silicon particles.

Specifically, a photosensor element according to the present invention is provided with a gate electrode disposed on an insulating substrate, a gate insulating film disposed so as to cover the gate electrode, a semiconductor layer disposed on the gate insulating film so as to overlap the gate electrode, and a source electrode and a drain electrode provided on the semiconductor layer so as to overlap the gate electrode and so as to face each other, wherein the semiconductor layer is provided with an intrinsic semiconductor layer in which a channel region is defined and an extrinsic semiconductor layer that is laminated on the intrinsic semiconductor layer such that the channel region is exposed therefrom, and wherein the intrinsic semiconductor layer is an amorphous silicon layer that contains nanocrystalline silicon particles.

According to the above-mentioned configuration, in the photosensor elements that are constituted of bottom-gate thin-film transistors that use amorphous silicon, the amorphous silicon layer that constitutes the intrinsic semiconductor layer contains the nanocrystalline silicon particles. Thus, the bandgap of the intrinsic semiconductor layer is made narrower (about 1.65 eV, for example) than the bandgap of the amorphous silicon (about 1.8 eV, for example). Although the bandgap of about 1.65 eV corresponds to a wavelength of 750 nm, because the absorption edge of the optical absorption spectrum of the intrinsic semiconductor layer shifts toward the longer wavelength side because of the narrower bandgap, the optical-absorption coefficient in the near-infrared region is increased. Consequently, a sufficient photocurrent is secured with an absorption component at the absorption edge of the optical absorption spectrum of the intrinsic semiconductor layer, which is around a wavelength of 850 nm, and therefore, the sensitivity to infrared light of the photosensor elements that use the amorphous silicon is increased.

FIG. 11 is a graph showing wavelength dependence of photocurrents generated in the photosensor elements. In FIG. 11, a curved line α shows the wavelength dependence of the photosensor element of the present invention. A curved line β shows the wavelength dependence of a conventional photosensor element that uses amorphous silicon. A curved line γ shows the wavelength dependence of a conventional photosensor element that uses crystalline silicon.

The conventional photosensor element that uses the amorphous silicon (see the curved line β in FIG. 11) has a large optical-absorption coefficient due to a direct transition, and therefore, a large photocurrent is generated in the region of visible light. However, because the bandgap is 1.8 eV (688 nm), the photocurrent becomes significantly small at a longer wavelength than 688 nm, and therefore, the photocurrent generated in the infrared region (850 nm or longer) becomes small. Because of this, the sensitivity to infrared light becomes low, and a big difference between the sensitivity to infrared light and the sensitivity to visible light is created. Thus, even if an attempt is made to detect infrared light, the insufficient sensitivity and stray visible light make it difficult to detect infrared light.

In the photosensor element of the present invention (see the curved line α in FIG. 11), on the other hand, because the bandgap is made narrower as described above, and the absorption edge of the optical absorption spectrum of the intrinsic semiconductor layer thereby shifts to the longer wavelength side, the photocurrent generated in the infrared region becomes large.

In the conventional photosensor element that uses crystalline silicon (see the curved line γ in FIG. 11), the overall optical-absorption coefficient is small because of an indirect transition, and therefore, in order to obtain a sufficient sensitivity as a sensor, it is required to use an amplifier circuit or to increase the thickness of a crystalline silicon film.

The nanocrystalline silicon may have a particle size of 2 nm to 10 nm. A crystallization ratio of the intrinsic semiconductor layer may be 5% to 20%.

According to this configuration, the particle size of the nanocrystalline silicon is 2 nm to 10 nm, and the crystallization ratio of the intrinsic semiconductor layer is 5% to 20%.

Therefore, in the photosensor elements that use the amorphous silicon, the bandgap can be made narrower while maintaining the high optical-absorption coefficient of the amorphous silicon. If the particle size of the nanocrystalline silicon is smaller than 2 nm, the optical property thereof becomes similar to that of typical amorphous silicon, and if the particle size of the nanocrystalline silicon is larger than 10 nm, the optical property thereof becomes similar to that of typical crystalline silicon. If the crystallization ratio of the intrinsic semiconductor layer is lower than 5%, it becomes difficult to achieve the effect of the narrower bandgap, and if the crystallization ratio of the intrinsic semiconductor layer is higher than 20%, the optical-absorption coefficient becomes too small.

A photosensor circuit according to the present invention is provided with a photosensor element and an amplifier element that is connected to the photosensor element. The photosensor element is provided with a gate electrode disposed on an insulating substrate, a gate insulating film disposed so as to cover the gate electrode, a semiconductor layer disposed on the gate insulating film so as to overlap the gate electrode, and a source electrode and a drain electrode provided on the semiconductor layer so as to overlap the gate electrode and so as to face each other. The semiconductor layer is provided with an intrinsic semiconductor layer in which a channel region is defined and an extrinsic semiconductor layer that is laminated on the intrinsic semiconductor layer such that the channel region is exposed therefrom. The intrinsic semiconductor layer is an amorphous silicon layer that contains nanocrystalline silicon particles.

According to this configuration, in the photosensor elements, that is, in the photosensor elements constituted of the bottom-gate thin-film transistors that use amorphous silicon, the amorphous silicon layer that constitutes the intrinsic semiconductor layer contains the nanocrystalline silicon particles. Thus, the bandgap of the intrinsic semiconductor layer is narrower (about 1.65 eV, for example) than the bandgap of amorphous silicon (about 1.8 eV, for example). Although the bandgap of about 1.65 eV corresponds to a wavelength of 750 nm, because the absorption edge of the optical absorption spectrum of the intrinsic semiconductor layer shifts to the longer wavelength side due to the narrowed bandgap, the optical-absorption coefficient in the near-infrared region is increased. Consequently, in the photosensor elements that use amorphous silicon, a sufficient photocurrent is secured with an absorption component at the absorption edge of the optical absorption spectrum of the intrinsic semiconductor layer, which is around a wavelength of 850 nm. This allows the photosensor circuits provided with the photosensor elements and amplifier elements to have the improved sensitivity to infrared light.

The amplifier element may be provided with an amplifier gate electrode disposed on the insulating substrate, the gate insulating film disposed so as to cover the amplifier gate electrode, an amplifier semiconductor layer disposed on the gate insulating film so as to overlap the amplifier gate electrode, and an amplifier source electrode and an amplifier drain electrode provided on the amplifier semiconductor layer so as to overlap the amplifier gate electrode and so as to face each other. The amplifier semiconductor layer may be provided with an amplifier intrinsic semiconductor layer in which a channel region is defined and an amplifier extrinsic semiconductor layer that is laminated on the amplifier intrinsic semiconductor layer such that the channel region is exposed therefrom. The amplifier intrinsic semiconductor layer may be an amorphous silicon layer that contains nanocrystalline silicon particles.

According this configuration, the amplifier element is provided with the amplifier gate electrode that corresponds to the gate electrode of the photosensor element, the same gate insulating film as that of the photosensor element, the amplifier semiconductor layer that corresponds to the semiconductor layer of the photosensor element, the amplifier source electrode and the amplifier drain electrode that respectively correspond to the source electrode and the drain electrode of the photosensor element, the amplifier intrinsic semiconductor layer that corresponds to the intrinsic semiconductor layer of the photosensor element, and the amplifier extrinsic semiconductor layer that corresponds to the extrinsic semiconductor layer of the photosensor element. Therefore, the amplifier element can be formed using steps of forming the photosensor element.

A thin-film transistor substrate according to the present invention is provided with a plurality of pixels arranged in a matrix, a plurality of switching elements respectively disposed in the pixels, and a plurality of photosensor elements respectively disposed in the pixels. Each of the photosensor elements is provided with a gate electrode disposed on an insulating substrate, a gate insulating film disposed so as to cover the gate electrode, a semiconductor layer disposed on the gate insulating film so as to overlap the gate electrode, and a source electrode and a drain electrode provided on the semiconductor layer so as to overlap the gate electrode and so as to face each other. The semiconductor layer is provided with an intrinsic semiconductor layer in which a channel region is defined and an extrinsic semiconductor layer that is laminated on the intrinsic semiconductor layer such that the channel region is exposed therefrom. The intrinsic semiconductor layer is an amorphous silicon layer that contains nanocrystalline silicon particles.

According to this configuration, in the photosensor elements, that is, in the photosensor elements constituted of the bottom-gate thin-film transistors that use the amorphous silicon, the amorphous silicon layer that constitutes the intrinsic semiconductor layer contains nanocrystalline silicon particles. Thus, the bandgap of the intrinsic semiconductor layer is narrower (about 1.65 eV for example) than the bandgap of the amorphous silicon (about 1.8 eV for example). Although the bandgap of about 1.65 eV corresponds to a wavelength of 750 nm, because the absorption edge of the optical absorption spectrum in the intrinsic semiconductor layer shifts to the longer wavelength side due to the narrowed bandgap, the optical-absorption coefficient in the near-infrared region is increased. Consequently, in the photosensor elements that use the amorphous silicon, a sufficient photocurrent is secured with an absorption component at the absorption edge of the optical absorption spectrum of the intrinsic semiconductor layer, which is around a wavelength of 850 nm. Therefore, the sensitivity to the infrared light of the thin-film transistor substrate in which the respective pixels are provided with the switching elements and the photosensor elements is improved.

Each of the switching elements may be provided with a switching gate electrode disposed on the insulating substrate, the gate insulating film disposed so as to cover the switching gate electrode, a switching semiconductor layer disposed on the gate insulating film so as to overlap the switching gate electrode, and a switching source electrode and a switching drain electrode provided on the switching semiconductor layer so as to overlap the switching gate electrode and so as to face each other. The switching semiconductor layer may be provided with a switching intrinsic semiconductor layer in which a channel region is defined and a switching extrinsic semiconductor layer that is laminated on the switching intrinsic semiconductor layer such that the channel region is exposed therefrom. The switching intrinsic semiconductor layer may be an amorphous silicon layer that contains nanocrystalline silicon particles. A light-shielding layer may be provided so as to cover the respective switching element.

According to this configuration, the switching element in each pixel is provided with the switching gate electrode that corresponds to the gate electrode of the photosensor element, the same gate insulating film as that of the photosensor element, the switching semiconductor layer that corresponds to the semiconductor layer of the photosensor element, the switching source electrode and the switching drain electrode that respectively correspond to the source electrode and the drain electrode of the photosensor element, the switching intrinsic semiconductor layer that corresponds to the intrinsic semiconductor layer of the photosensor element, and the switching extrinsic semiconductor layer that corresponds to the extrinsic semiconductor layer of the photosensor element. Therefore, the switching element can be formed using steps of forming the photosensor element. Further, because the light-shielding layer is provided so as to cover the switching element in each pixel, it becomes possible to suppress the degradation of the OFF characteristics of the switching element.

The thin-film transistor substrate may have a plurality of amplifier elements provided in the respective pixels. Each of the amplifier elements may be provided with an amplifier gate electrode disposed on the insulating substrate, the gate insulating film disposed so as to cover the amplifier gate electrodes, the amplifier semiconductor layer disposed on the gate insulating film so as to overlap the amplifier gate electrode, and the amplifier source electrode and the amplifier drain electrode provided on the amplifier semiconductor layer so as to overlap the amplifier gate electrode and so as to face each other. The amplifier semiconductor layer may be provided with an amplifier intrinsic semiconductor layer in which a channel region is defined and an amplifier extrinsic semiconductor layer that is laminated on the amplifier intrinsic semiconductor layer such that the channel region is exposed therefrom. The amplifier intrinsic semiconductor layer may be an amorphous silicon layer that contains nanocrystalline silicon particles. A light-shielding layer may be provided so as to cover a respective amplifier element.

According this configuration, the amplifier element in each pixels is provided with the amplifier gate electrode that corresponds to the gate electrode of the photosensor element, the same gate insulating film as that of the photosensor element, the amplifier semiconductor layer that corresponds to the semiconductor layer of the photosensor element, the amplifier source electrode and the amplifier drain electrode that respectively correspond to the source electrode and the drain electrode of the photosensor element, the amplifier intrinsic semiconductor layer that corresponds to the intrinsic semiconductor layer of the photosensor element, and the amplifier extrinsic semiconductor layer that corresponds to the extrinsic semiconductor layer of the photosensor element. Therefore, not only the switching element, but also the amplifier element may be formed using steps of forming the photosensor element. Further, because the light-shielding layer is provided so as to cover the amplifier element in each pixel, it becomes possible to prevent an erroneous operation of the amplifier element caused by light, and to suppress the degradation of the characteristics of the amplifier element.

A display panel according to the present invention is provided with a thin-film transistor substrate having the above-mentioned configuration, an opposite substrate disposed so as to face the thin-film transistor substrate, and a display medium layer disposed between the thin-film transistor substrate and the opposite substrate.

According to this configuration, the sensitivity to the infrared light of the photosensor elements provided in the respective pixels of the thin-film transistor substrate is improved. Therefore, it is possible to achieve a display panel with a touch panel function that has a high sensitivity and that is less likely to be affected by ambient light.

Effects of the Invention

According to the present invention, the intrinsic semiconductor layer is an amorphous silicon layer that contains nanocrystalline silicon particles. This makes it possible to improve the sensitivity to infrared light in the photosensor elements that use amorphous silicon.

DETAILED DESCRIPTION OF EMBODIMENTS

Embodiments of the present invention will be described below in detail with reference to figures. The present invention is not limited to the respective embodiments below.

Embodiment 1

Figure 1:
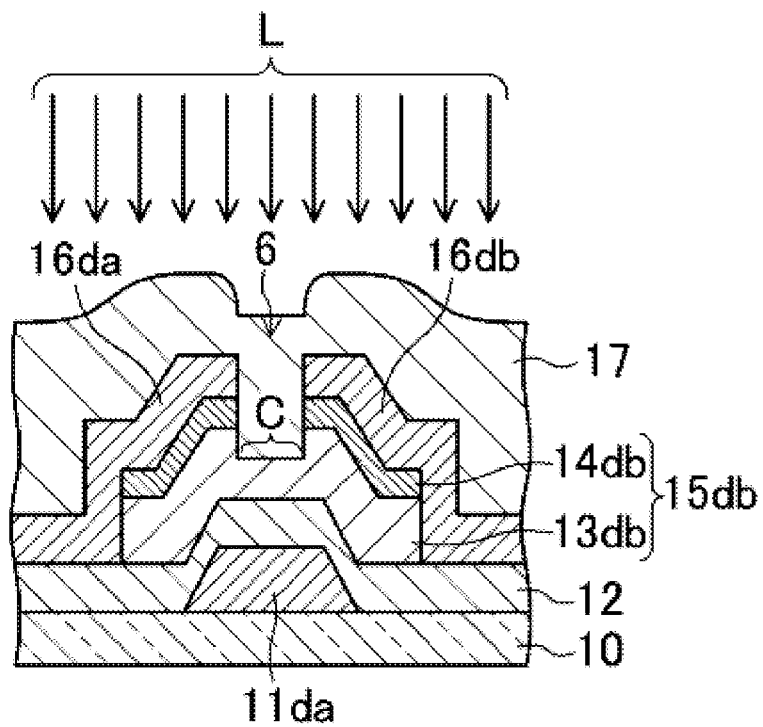
FIG. 1 is a cross-sectional view of a photosensor element 6 according to Embodiment 1.
Figure 2:
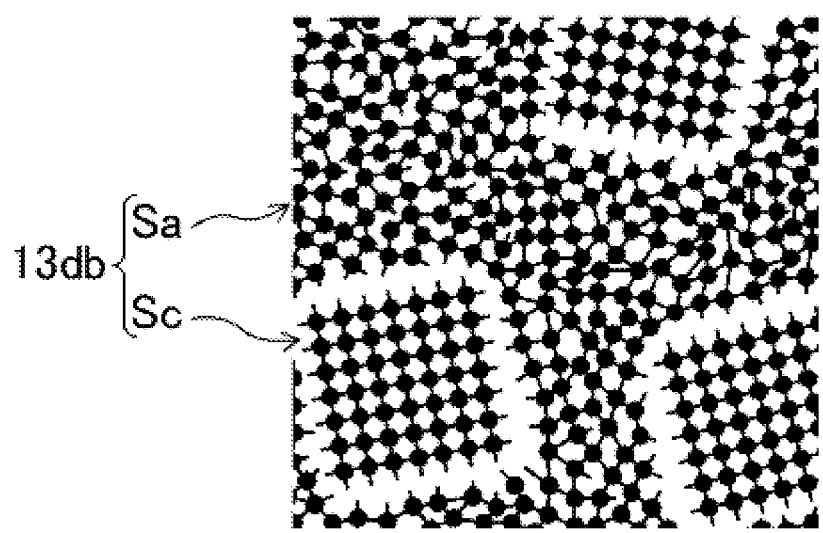
FIG. 2 is a conceptual figure of an intrinsic semiconductor layer 13db that constitutes the photosensor element 6.
Figure 3:
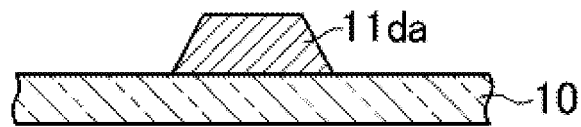
FIG. 3 is an explanatory figure for showing steps of manufacturing the photosensor element 6 in cross-sectional view.
Figure 3:
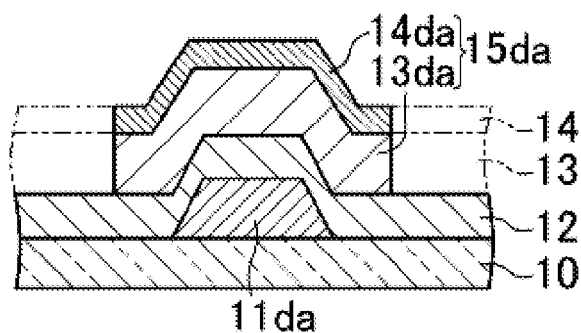
Figure 3:
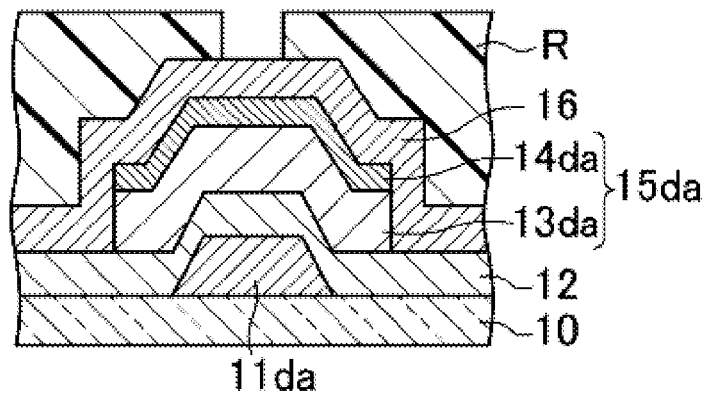
Figure 3:
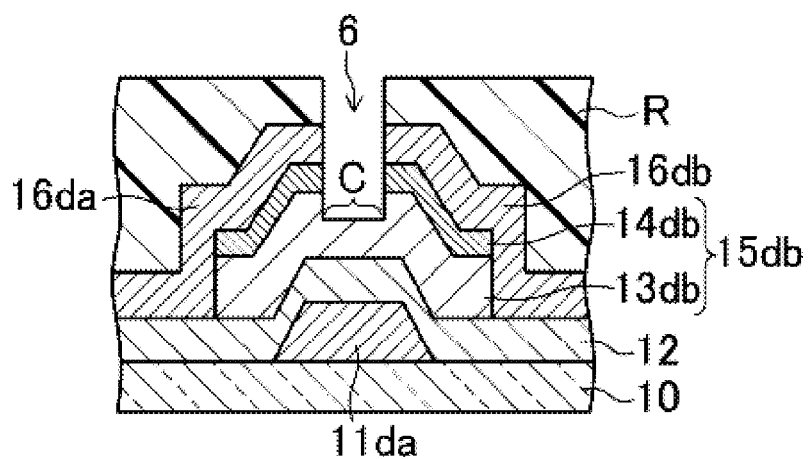

FIGS. 1 to 3 show Embodiment 1 of a photosensor element according to the present invention. Specifically, FIG. 1 is a cross-sectional view of a photosensor element 6 of the present embodiment. FIG. 2 is a conceptual figure conceptually showing an intrinsic semiconductor layer 13db that constitutes the photosensor element 6. FIG. 3 is an explanatory figure showing steps of manufacturing the photosensor element 6 in cross-sectional view.

As shown in FIG. 1, the photosensor element 6 is provided with a gate electrode 11da disposed on an insulating substrate 10, a gate insulating film 12 disposed so as to cover the gate electrode 11da, a semiconductor layer 15db disposed on the gate insulating film 12 so as to overlap the gate electrode 11da, a source electrode 16da and a drain electrode 16db provided on the semiconductor layer 15db so as to overlap the gate electrode 11*da* and so as to face each other. The photosensor element 6 is configured so as to detect infrared light L. Further, as shown in FIG. 1, a protective film 17 is provided in an upper layer of the photosensor element 6.

As shown in FIG. 1, the semiconductor layer 15*db* is provided with the intrinsic semiconductor layer 13*db* in which a channel region C is defined and an extrinsic semiconductor layer 14*db* that is laminated on the intrinsic semiconductor layer 13*db* such that the channel region C is exposed therefrom.

As shown in FIG. 2, the intrinsic semiconductor layer 13*db* is an amorphous silicon layer Sa that contains particles of nanocrystalline silicon Sc. As shown in FIG. 2, in the amorphous silicon layer Sa, respective silicon atoms are randomly arranged, and in the nanocrystalline silicon Sc, respective silicon atoms are orderly arranged. The particle size of the nanocrystalline silicon Sc is 2 nm to 10 nm, for example. The crystallization ratio of the intrinsic semiconductor layer 13*db* is 5% to 20%, for example. This makes it possible to make the bandgap narrower while maintaining the high optical-absorption coefficient of amorphous silicon. If the particle size of the nanocrystalline silicon Sc is smaller than 2 nm, the optical property would become similar to that of typical amorphous silicon, and if the particle size of the nanocrystalline silicon Sc is larger than 10 nm, the optical property would become similar to that of typical crystalline silicon. If the crystallization ratio of the intrinsic semiconductor layer 13*db* is lower than 5%, it would make it difficult to achieve the effect of the narrower bandgap, and if the crystallization ratio of the intrinsic semiconductor layer 13*db* is higher than 20%, the optical-absorption coefficient would become too low. The crystallization ratio of the intrinsic semiconductor layer 13*db* is derived by the Raman spectroscopy, for example. Specifically, in the Raman spectrum of the intrinsic semiconductor layer 13*db*, peaks ($c_1$ and $c_2$) attributed to the crystalline silicon are observed around the wavenumber 520 $cm^{-2}$ and around the wavenumber 500 $cm^{-2}$, respectively, and a peak (Pa) attributed to the amorphous silicon is observed around the wavenumber 480 $cm^{-2}$. Then, peak areas ($Ic_1$, $Ic_2$, and Ia) of the respective peaks ($c_1$, $c_2$, and a) are respectively calculated by separating peak components (deconvolution), and a value of the crystallization ratio of the intrinsic semiconductor layer 13*db* is derived from $(Ic_1+Ic_2)/(Ic_1+Ic_2+Ia) \times 100$. The shape of the crystals (granular or columnar) in the intrinsic semiconductor layer 13*db* is confirmed by an analysis using a TEM (Transmission Electron Microscope), for example.

The extrinsic semiconductor layer 14*db* is an $N^+$ amorphous silicon layer that is doped with phosphorus as an impurity, for example.

Next, a method of manufacturing the photosensor element 6 of the present embodiment will be described with reference to FIG. 3.

First, on the entire insulating substrate 10, which is a glass substrate or the like, a titanium film (about 50 nm thick), an aluminum film (about 200 nm thick), a titanium film (about 150 nm thick), and the like, for example, are deposited in this order by sputtering. Thereafter, as shown in FIG. 3(*a*), by patterning the multilayer metal film by photolithography, the gate electrode 11*da* is formed.

Next, on the entire substrate having the gate electrodes 11*da* formed thereon, an inorganic insulating film such as a silicon nitride film or a silicon oxide film (about 400 nm thick), for example, is deposited by the plasma CVD (Chemical Vapor Deposition) method, thereby forming the gate insulating film 12 (see FIG. 3(*b*)).

Next, as shown in FIG. 3(*b*), on the entire substrate having the gate insulating film 12 formed thereon, an intrinsic semiconductor film 13 (about 20 nm to 200 nm thick) and an extrinsic semiconductor film 14 such as an $N^+$ amorphous silicon film (about 50 nm thick) are laminated in this order by the plasma CVD method. Thereafter, by patterning the multilayer semiconductor film constituted of the intrinsic semiconductor film 13 and the extrinsic semiconductor film 14 by photolithography, a semiconductor structure layer 15*da* constituted of an intrinsic semiconductor layer 13*da* and an extrinsic semiconductor layer 14*da* is formed. The intrinsic semiconductor film 13 is deposited by using a capacitance coupling type CVD device under the following conditions, for example: the power of high-frequency power source is 10 $W/m^2$ to 50 $W/m^2$; the deposition pressure is 266 Pa to 1333 Pa; and the flow volume ratios of an $SiH_4$ gas to an $H_2$ gas and to an Ar gas are respectively 1:20 to 1:100, or the flow volume ratio of an $SiH_4$ gas to an $H_2$ gas is 1:40 to 1:200. In other words, the intrinsic semiconductor film 13 is formed under the higher dilution ratio of the $SiH_4$ gas, the weaker deposition power, and the higher deposition pressure as compared with the deposition conditions for a typical amorphous silicon film.

Next, as shown in FIG. 3(*c*), on the entire substrate having the semiconductor structure layer 15*da* formed thereon, a titanium film (about 100 nm thick), an aluminum film (about 200 nm thick), and the like, for example, are deposited in this order by sputtering, thereby forming a metal film 16. Thereafter, a resist pattern R is formed on the metal film 16.

Further, as shown in FIG. 3(*d*), by removing the metal film 16 exposed from the resist pattern R and the semiconductor structure layer 15*da* under the metal film 16 by anisotropic dry etching, the semiconductor layer 15*db* constituted of the intrinsic semiconductor layer 13*db* and the extrinsic semiconductor layer 14*db*, the source electrode 16*da*, and the drain electrode 16*db* are formed.

Lastly, after the resist pattern R is removed, the protective film 17 is formed by depositing an inorganic insulating film such as a silicon nitride film or a silicon oxide film (about 400 nm thick), for example, by the plasma CVD method so as to cover the source electrode 16*da* and the drain electrode 16*db*.

The photosensor element 6 of the present embodiment can be manufactured in the manner descried above.

As described above, according to the photosensor element 6 of the present embodiment, in the photosensor element 6 made of the bottom-gate TFT that uses amorphous silicon, the amorphous silicon layer Sa that constitutes the intrinsic semiconductor layer 13*db* contains the particles of nanocrystalline silicon Sc. Thus, the bandgap of the intrinsic semiconductor layer 13*db* is made narrower (about 1.65 eV, for example) than the bandgap of the amorphous silicon (about 1.8 eV, for example). Although the bandgap of about 1.65 eV corresponds to a wavelength of 750 nm, because the absorption edge of the optical absorption spectrum of the intrinsic semiconductor layer 13*db* shifts to the longer wavelength side due to the narrowed bandgap, the optical-absorption coefficient in the near-infrared region is increased. Consequently, a sufficient photocurrent can be secured with an absorption component at the absorption edge of the optical absorption spectrum of the intrinsic semiconductor layer 13*db*, which is around a wavelength of 850 nm. This makes it possible to increase the sensitivity to the infrared light L of the photosensor element 6 that uses the amorphous silicon.

Embodiment 2

Figure 4:
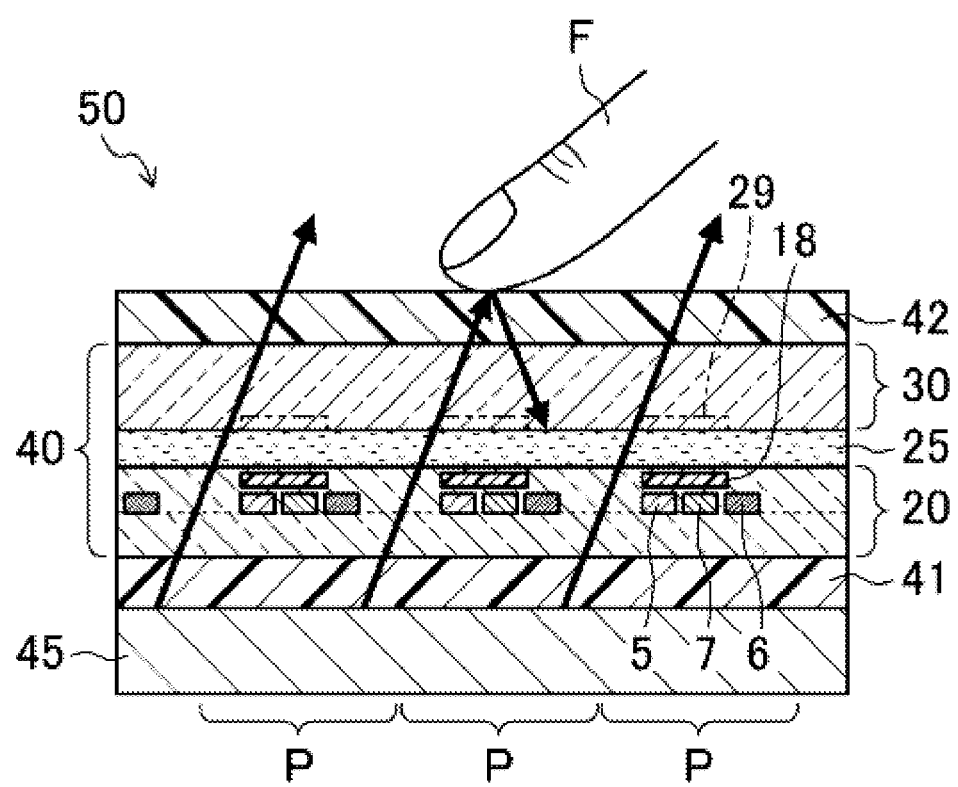
FIG. 4 is a cross-sectional view of a liquid crystal display device 50 according to Embodiment 2.
Figure 5:
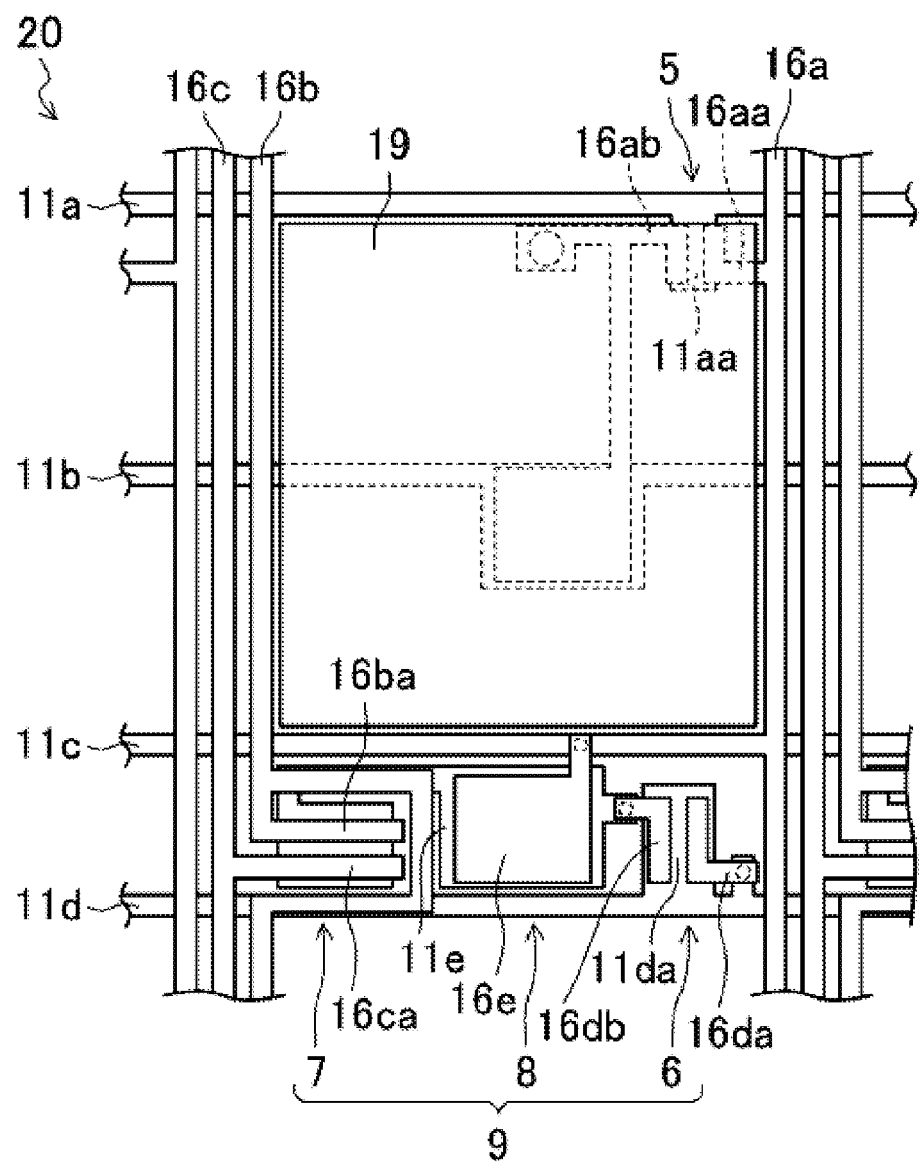
FIG. 5 is a plan view of a TFT substrate 20 that constitutes the liquid crystal display device 50.
Figure 6:
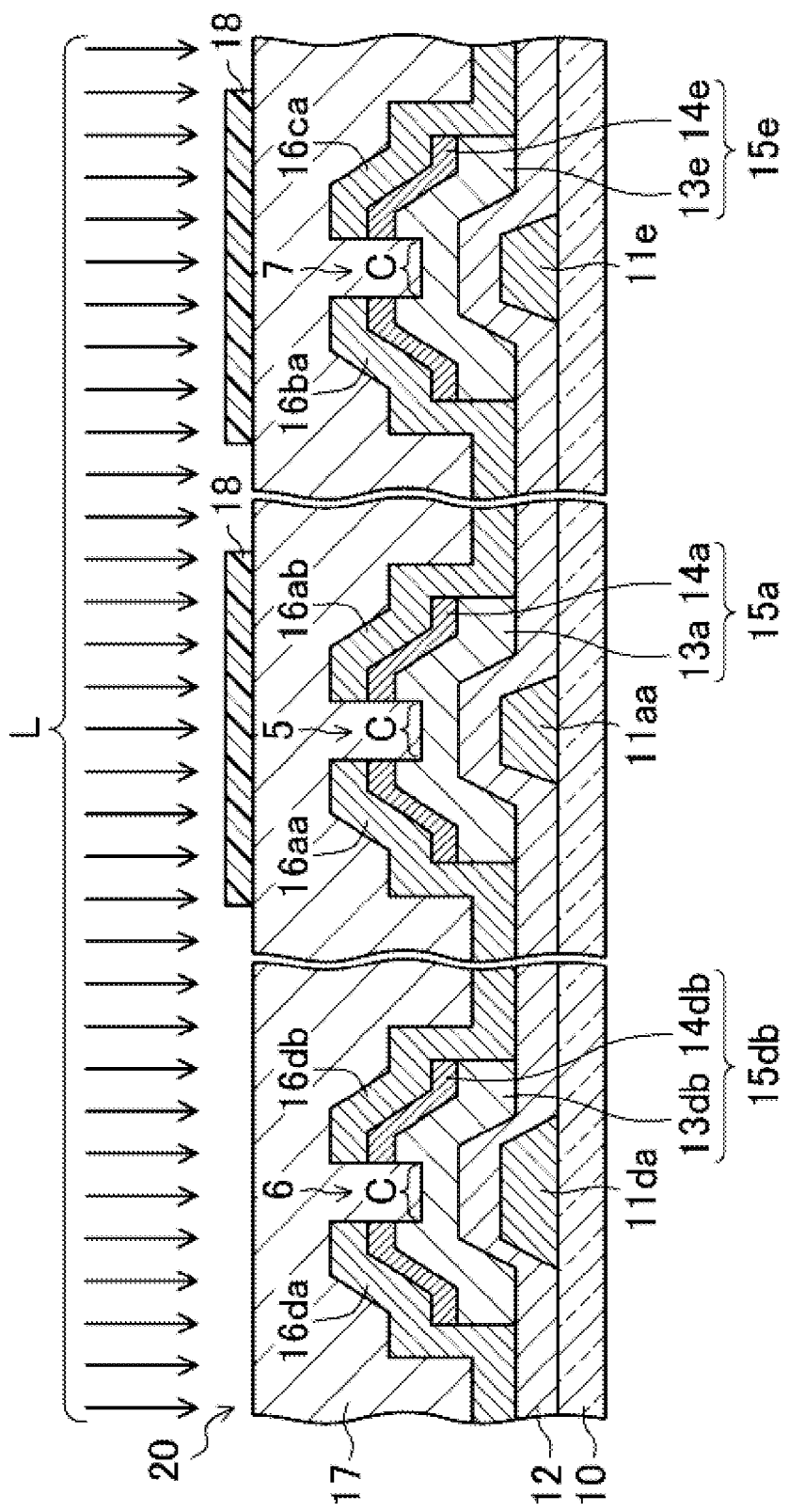
FIG. 6 is a cross-sectional view of the TFT substrate 20.
Figure 7:
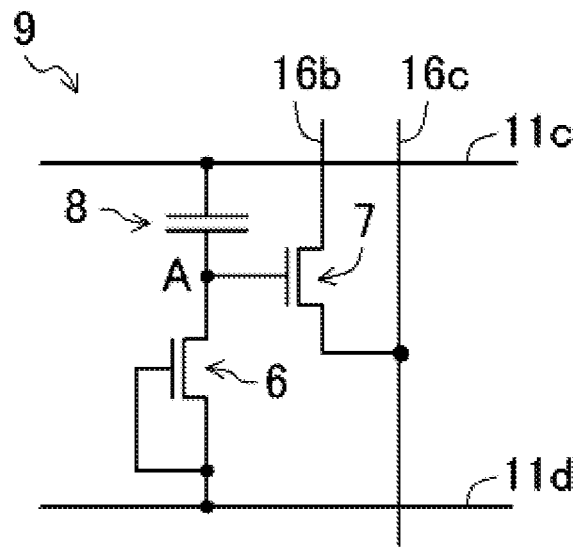
FIG. 7 is an equivalent circuit diagram of a photosensor circuit 9 that constitutes the TFT substrate 20.
Figure 8:
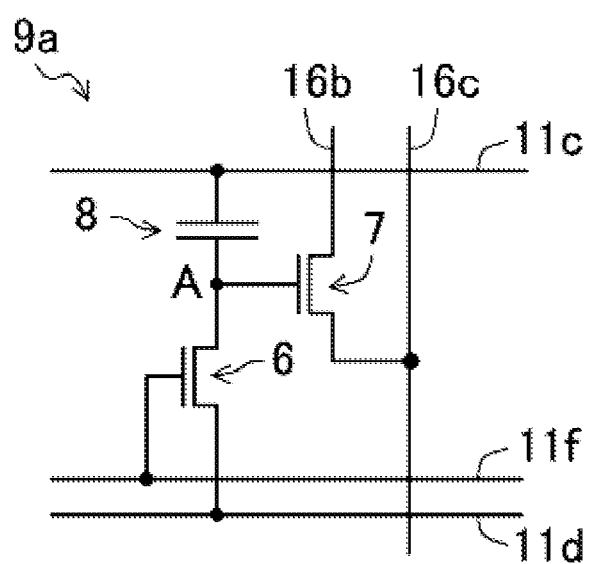
FIG. 8 is an equivalent circuit diagram of a photosensor circuit 9a, which is a modification example of the photosensor circuit 9.
Figure 9:
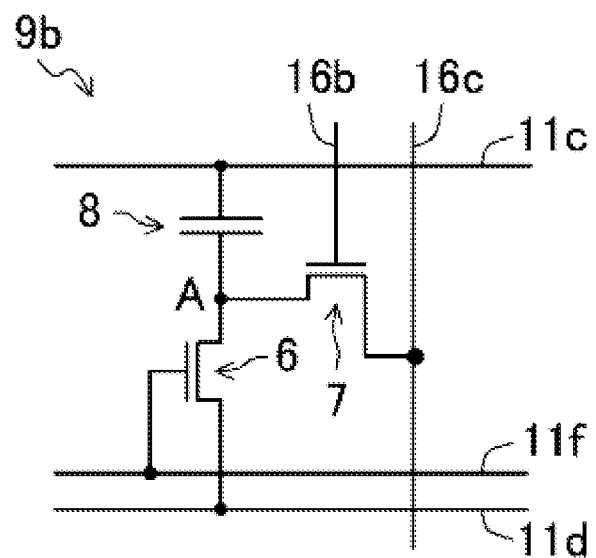
FIG. 9 is an equivalent circuit diagram of a photosensor circuit 9b, which is a modification example of the photosensor circuit 9.
Figure 10:
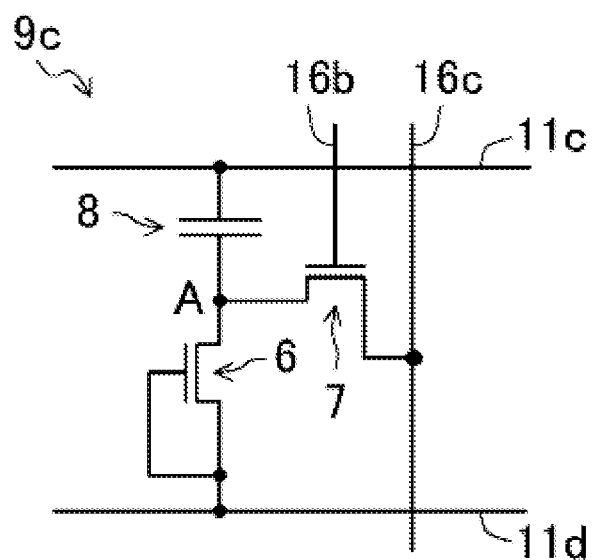
FIG. 10 is an equivalent circuit diagram of a photosensor circuit 9c, which is a modification example of the photosensor circuit 9.
Figure 11:
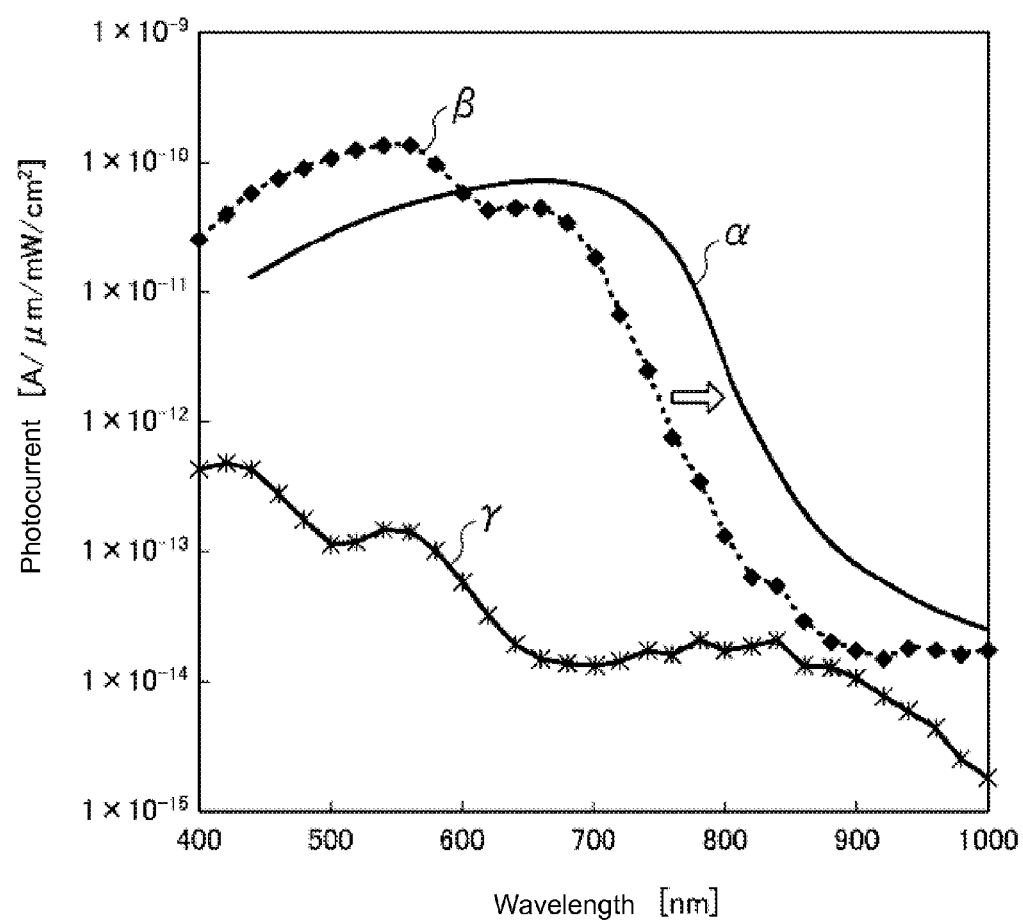
FIG. 11 is a graph showing wavelength dependence of photocurrents generated in the photosensor elements.

FIGS. 4 to 9 show a photosensor element, a photosensor circuit, a TFT substrate, and a display panel according to Embodiment 2 of the present invention. Specifically, FIG. 4 is a cross-sectional view of a liquid crystal display device 50 of the present embodiment. FIG. 5 is a plan view of a TFT substrate 20 that constitutes the liquid crystal display device 50. FIG. 6 is a cross-sectional view of the TFT substrate 20. FIG. 7 is an equivalent circuit diagram of a photosensor circuit 9 that constitutes the TFT substrate 20. FIGS. 8, 9, and 10 are equivalent circuit diagrams of photosensor circuits 9a, 9b, and 9c respectively showing modification examples of the photosensor circuit 9. In the embodiment below, the same reference characters are given to the same components as those of FIGS. 1 to 3, and the detailed descriptions thereof are omitted.

As shown in FIG. 4, the liquid crystal display device 50 is provided with a liquid crystal display panel 40 that displays an image, a polarizing plate 41 that is bonded to the rear surface side of the liquid crystal display panel 40, a polarizing plate 42 that is bonded to the front surface side of the liquid crystal display panel 40, and a backlight 45 that is disposed on the rear surface side of the liquid crystal display panel 40 having the polarizing plate 41 interposed therebetween. The liquid crystal display device 50 is configured such that the photosensor elements 6 and the like provided in respective pixels P, each of which is the smallest unit of an image, detect a touch position based on a light intensity difference caused by presence or absence of a finger F on the surface of the polarizing plate 42.

As shown in FIG. 4, the liquid crystal display panel 40 is provided with the TFT substrate 20 and an opposite substrate 30 that are disposed so as to face each other, and a liquid crystal layer 25 that is provided between the TFT substrate 20 and the opposite substrate 30 as a display medium layer and that is sealed by a frame-shaped sealing material (not shown).

As shown in FIGS. 5 and 7, the TFT substrate 20 is provided with a plurality of gate lines 11a arranged so as to extend in parallel to each other along the horizontal direction in the figures, capacitance lines 11b, select wiring lines 11c, and initialization wiring lines 11d that are respectively arranged so as to extend in parallel to each other between the respective gate lines 11a, a plurality of source lines 16a arranged so as to extend in parallel to each other along the vertical direction in the figures, power-supply voltage wiring lines 16b and output wiring lines 16c arranged near the respective source lines 16a and so as to extend in parallel to each other, switching elements 5 disposed at the respective intersections of the gate lines 11a and the source lines 16a, i.e., in the respective pixels P, the photosensor circuits 9 disposed between the select wiring lines 11c and the initialization wiring lines 11d in the respective pixels P, the protective film 17 (see FIG. 6) disposed so as to cover the respective switching elements 5 and the photosensor circuits 9, a plurality of pixel electrodes 19 arranged in a matrix on the protective film 17, and an alignment film (not shown) disposed so as to cover the respective pixel electrodes 19.

As shown in FIGS. 5 and 6, the switching element 5 is provided with a switching gate electrode 11aa disposed on the insulating substrate 10, the gate insulating film 12 disposed so as to cover the switching gate electrode 11aa, a switching semiconductor layer 15a formed in an island shape on the gate insulating film 12 so as to overlap the switching gate electrode 11aa, and a switching source electrode 16aa and a switching drain electrode 16ab provided on the switching semiconductor layer 15a so as to overlap the switching gate electrode 11aa and so as to face each other. As shown in FIG. 5, the switching gate electrode 11aa is a portion of the gate line 11a that protrudes to the side, and the switching source electrode 16aa is a portion of the source line 16a that protrudes to the side. As shown in FIG. 5, the switching drain electrode 16ab is connected to the pixel electrode 19 via a contact hole (a dashed circle in the figure) formed in the protective film 17 (see FIG. 6), and overlaps the capacitance line 11b through the gate insulating film 12 (see FIG. 6), thereby forming an auxiliary capacitance. Further, as shown in FIG. 6, the switching semiconductor layer 15a is provided with a switching intrinsic semiconductor layer 13a in which a channel region C is defined and a switching extrinsic semiconductor layer 14a that is laminated on the switching intrinsic semiconductor layer 13a such that the channel region C is exposed therefrom.

The switching intrinsic semiconductor layer 13a is the amorphous silicon layer Sa (see FIG. 2) that contains particles of the nanocrystalline silicon Sc (see FIG. 2).

The switching extrinsic semiconductor layer 14a is an N$^+$ amorphous silicon layer that is doped with phosphorus as an impurity, for example.

As shown in FIGS. 5 and 7, the photosensor circuit 9 is provided with the photosensor element 6 of Embodiment 1 above, an amplifier element 7 connected to the photosensor element 6, and a capacitor element 8 connected to the photosensor element 6 and the amplifier element 7.

As shown in FIG. 5, in the photosensor element 6, the gate electrode 11da is a portion of the initialization wiring line 11d that protrudes to the side. The source electrode 16da is connected to the initialization wiring line 11d via a contact hole (a dashed circle in the figure) formed in the gate insulating film 12. The drain electrode 16db is connected to the capacitor element 8 (to the lower electrode 11e thereof, which will be described later) via a contact hole (a dashed circle in the figure) formed in the gate insulating film 12.

As shown in FIGS. 5, 6, and 7, the amplifier element 7 is provided with an amplifier gate electrode 11e disposed on the insulating substrate 10, the gate insulating film 12 disposed so as to cover the amplifier gate electrode 11e, an amplifier semiconductor layer 15e formed in an island shape on the gate insulating film 12 so as to overlap the amplifier gate electrode 11e, and an amplifier source electrode 16ba and an amplifier drain electrode 16ca provided on the amplifier semiconductor layer 15e so as to overlap the amplifier gate electrode 11e and so as to face each other. As shown in FIG. 5, the amplifier source electrode 16ba is a branched part of the power-supply voltage wiring line 16b. Further, as shown in FIG. 5, the amplifier drain electrode 16ca is a portion of the output wiring line 16c that protrudes to the side. As shown in FIG. 6, the amplifier semiconductor layer 15e is provided with an amplifier intrinsic semiconductor layer 13e in which a channel region C is defined and an amplifier extrinsic semiconductor layer 14e that is laminated on the amplifier intrinsic semiconductor layer 13e such that the channel region C is exposed therefrom.

The amplifier intrinsic semiconductor layer 13e is the amorphous silicon layer Sc (see FIG. 2) that contains particles of the nanocrystalline silicon Sc (see FIG. 2).

The amplifier extrinsic semiconductor layer 14e is an N$^+$ amorphous silicon layer that is doped with phosphorus as an impurity, for example.

As shown in FIGS. 5 and 7, the capacitor element 8 is provided with the lower electrode (11e) connected to the amplifier gate electrode 11e, the gate insulating film 12 disposed so as to cover the lower electrode (11e), and an upper electrode 16e disposed on the gate insulating film 12 so as to overlap the lower electrode (11e).

As shown in FIGS. 4 and 6, in the TFT substrate 20, light-shielding layers 18 are provided so as to cover the switching elements 5 and the amplifier elements 7. It should be noted that the light-shielding layers 18 are not shown in the TFT substrate 20 in FIG. 5, and the pixel electrodes 19 are not shown in the TFT substrate 20 in FIG. 6.

The opposite substrate 30 is provided with a black matrix (not shown) disposed on an insulating substrate (not shown) in a grid pattern, a plurality of colored layers (not shown) such as red layers, green layers, and blue layers that are respectively disposed in the respective grids of the black matrix, a common electrode (not shown) disposed so as to cover the black matrix and the respective colored layers, photospacers (not shown) in a columnar shape disposed on the common electrode, and an alignment film (not shown) disposed so as to cover the common electrode. In the present embodiment, the configuration in which the light-shielding layers 18 that block light from entering the switching elements 5 and the amplifier elements 7 are provided in the TFT substrate 20 was described as an example, but alternatively, light-shielding layers 29 (see a two-dot chain line in FIG. 4) may be provided in the opposite substrate 30 using the black matrix on the opposite substrate 30, for example.

The liquid crystal layer 25 is made of a nematic liquid crystal material or the like having electrooptic characteristics.

In the liquid crystal display device 50 having the above-mentioned configuration, an image is displayed in the following manner: when a scan signal is sent to the switching gate electrodes 11aa of the switching elements 5 in the respective pixels P through the gate lines 11a, and the switching elements 5 are thereby turned on, display signals are sent to the switching source electrodes 16aa through the source lines 16a, and prescribed electric charges are written in the respective pixel electrodes 19 through the switching semiconductor layers 15a and the switching drain electrodes 16ab; this creates electrical potential differences between the respective pixel electrodes 19 in the TFT substrate 20 and the common electrode in the opposite substrate 30 in the liquid crystal display device 50, and therefore, a prescribed voltage is applied to the liquid crystal layer 25; and by changing the size of the voltage applied to the liquid crystal layer 25, the orientation state of the liquid crystal layer 25 in the respective pixels P is changed, which adjusts light transmittance of the liquid crystal layer 25, and an image is thereby displayed in the liquid crystal display device 50.

In the liquid crystal display device 50 having the above-mentioned configuration, in the respective pixels P, by setting the potential of the initialization wiring lines 11d to a high level, the potentials of the respective intersections A of the photosensor elements 6, the amplifier elements 7, and the capacitor elements 8 are reset, and are set to the high level. Then, while the potential of the intersections A is at the high level, the potential of the initialization wiring lines 11d is set to a low level, thereby turning the photosensor elements 6 off. If the photosensor elements 6 in the respective pixels P of the liquid crystal display device 50 receive light at this time, a large voltage drop occurs due to the photocurrent, and therefore, when the finger F touches the surface of the polarizing plate 42, the potential difference occurs between the intersections A of the pixels P that receive light (receive strong light) and the intersections A of the pixels P that do not receive light (receive weak light). Thereafter, in the liquid crystal display device 50, by setting the potentials of the select wiring lines 11c and the power-supply voltage wiring lines 16b to a high level, detection signals corresponding to the potential difference at the intersections A are output through the output wiring lines 16c. Output signals corresponding to the voltages/currents of the output detection signals are read out by a control LSI (Large Scale Integration), which thereby recognizes the pixels P that received light and the pixels P that did not receive light based on an algorithm for the potential difference, the current difference, the voltage absolute value, or the current absolute value, for example, of the output signals, and identifies presence or absence of a touch. In this manner, the point touched by the finger F on the surface of the polarizing plate 42 is detected.

Next, a method of manufacturing the TFT substrate 20 that constitutes the liquid crystal display device 50 of the present embodiment and that has the photosensor elements 6 will be described with reference to FIGS. 3 and 6.

First, on the entire insulating substrate 10, which is a glass substrate or the like, a titanium film (about 50 nm thick), an aluminum film (about 200 nm thick), a titanium film (about 150 nm thick) and the like, for example, are deposited in this order by sputtering. Next, the multilayer metal film is patterned by photolithography, thereby forming the gate lines 11a, the capacitance lines 11b, the select wiring lines 11c, the initialization wiring lines 11d, the switching gate electrodes 11aa, the gate electrodes 11da (for the photosensor elements), and the amplifier gate electrodes 11e as shown in FIGS. 3(a) and 6.

Next, on the entire substrate having the gate lines 11a, the capacitance lines 11b, the select wiring lines 11c, the initialization wiring lines 11d, the switching gate electrodes 11aa, the gate electrodes 11da, and the amplifier gate electrodes 11e formed thereon, an inorganic insulating film (about 400 nm thick) such as a silicon nitride film or a silicon oxide film, for example, is deposited by the plasma CVD method, and by patterning the inorganic insulating film by photolithography, the gate insulating film 12 having the contact holes (see FIGS. 3(b) and 6) is formed.

Further, as shown in FIG. 3(b), on the entire substrate having the gate insulating film 12 formed thereon, the intrinsic semiconductor film 13 (about 20 nm to 200 nm thick) and the extrinsic semiconductor film 14 such as an N$^+$ amorphous silicon film (about 50 nm thick) are deposited in this order by the plasma CVD method. Thereafter, by patterning the semiconductor multilayer film constituted of the intrinsic semiconductor film 13 and the extrinsic semiconductor film 14 by photolithography, the semiconductor structure layer 15da constituted of the intrinsic semiconductor layer 13da and the extrinsic semiconductor layer 14da, and not-shown other semiconductor structure layers (for the switching element and the amplifier element) are formed.

Next, as shown in FIG. 3(c), on the entire substrate having the semiconductor structure layer 15da and the other semiconductor structure layers formed thereon, a metal film 16 is formed by laminating an aluminum film (about 200 nm thick), a titanium film (about 100 nm thick) and the like in this order by sputtering, for example, and thereafter, the resist pattern R is formed on the metal film 16.

Next, as shown in FIGS. 3(d) and 6, anisotropic dry etching is performed to remove the metal film 16 exposed from the resist pattern R, the semiconductor structure layer 15da under the metal film 16, and the other semiconductor structure layers, thereby forming the semiconductor layer 15db for the photosensor element constituted of the intrinsic semiconductor layer 13db and the extrinsic semiconductor layer 14db, the switching semiconductor layer 15a constituted of the intrinsic semiconductor layer 13a and the extrinsic semiconductor layer 14a, the amplifier semiconductor layer 15e constituted of the intrinsic semiconductor layer 13e and the extrinsic semiconductor layer 14e, the source lines 16a, the power-supply voltage wiring lines 16b, the output wiring lines 16c, the switching source electrode 16aa, the switching drain electrode 16ab, the amplifier source electrode 16ba, the amplifier drain electrode 16ca, and the source electrode 16da and the drain electrode 16db for the photosensor element.

Subsequently, after the resist pattern R is removed, an inorganic insulating film (about 400 nm thick) such as a silicon nitride film or a silicon oxide film, for example, is deposited by the plasma CVD method so as to cover the semiconductor layer 15db (for the photosensor element), the switching semiconductor layer 15a, the amplifier semiconductor layer 15e, the source lines 16a, the power-supply voltage wiring lines 16b, the output wiring lines 16c, the switching source electrode 16aa, the switching drain electrode 16ab, the amplifier source electrode 16ba, the amplifier drain electrode 16ca, and the source electrode 16da and the drain electrode 16db (for the photosensor element). Thereafter, the inorganic insulating film is patterned by photolithography, and as a result, as shown in FIG. 6, the protective film 17 having contact holes is formed.

Next, on the entire substrate having the protective film 17 formed thereon, a black photosensitive resin film or the like containing carbon particles is deposited by the spin coat method, for example. Thereafter, by performing exposure and development to the photosensitive resin film, as shown in FIG. 6, the light-shielding layers 18 are formed. In the present embodiment, the light-shielding layers 18 made of the black photosensitive resin film are described as an example, but the light-shielding layers 18 may be made of a chromium film or the like.

Lastly, on the entire substrate having the light-shielding layers 18 formed thereon, a transparent conductive film such as an ITO film (about 100 nm thick), for example, is deposited by sputtering. Thereafter, the transparent conductive film is patterned by photolithography, thereby forming the pixel electrodes 19.

In this manner, the TFT substrate 20 of the present embodiment can be manufactured.

As described above, according to the photosensor element 6, the photosensor circuit 9, the TFT substrate 20, and the liquid crystal display panel 40 of the present embodiment, in the same manner as Embodiment 1, in the photosensor element 6 constituted of the bottom-gate TFT that uses amorphous silicon, a sufficient photocurrent can be secured with an absorption component at the absorption edge of the optical absorption spectrum of the intrinsic semiconductor layer 13db, which is around a wavelength of 850 nm. This makes it possible to increase the sensitivity to the infrared light L of the photosensor element 6 that uses the amorphous silicon.

According the TFT substrate 20 of the present embodiment, the switching element 5 and the amplifier element 7 in each of the pixels P are respectively provided with the switching gate electrode 11aa and the amplifier gate electrode 11e that correspond to the gate electrode 11da of the photosensor element 6, the same gate insulating film 12 as that of the photosensor element 6, the switching semiconductor layer 15a and the amplifier semiconductor layer 15e that correspond to the semiconductor layer 15db of the photosensor element 6, the switching source electrode 16aa, the switching drain electrode 16ab, the amplifier source electrodes 16ba, and the amplifier drain electrodes 16ca that respectively correspond to the source electrode 16da and the drain electrode 16db of the photosensor element 6, the switching intrinsic semiconductor layer 13a and the amplifier intrinsic semiconductor layer 13e that correspond to the intrinsic semiconductor layer 13db of the photosensor element 6, and the switching extrinsic semiconductor layer 14a and the amplifier extrinsic semiconductor layer 14e that correspond to the extrinsic semiconductor layer 14db of the photosensor element 6. Therefore, not only the switching elements 5, but also the amplifier elements 7 can be formed by utilizing the steps of forming the photosensor elements 6. The light-shielding layers 18 are provided so as to cover the respective switching elements 5 and the respective amplifier elements 7 in the respective pixels P, and therefore, it becomes possible to suppress a degradation of the OFF characteristics of the switching elements 5, and to prevent an erroneous operation and a degradation of the characteristics in the amplifier elements 7, which are caused by light.

According to the liquid crystal display panel 40 of the present embodiment, the sensitivity to the infrared light L of the photosensor elements 6 provided in the respective pixels P of the TFT substrate 20 is increased. This makes it possible to achieve the liquid crystal display panel 40 with a touch panel function that has a high sensitivity and that is not likely to be affected by ambient light.

In the present embodiment, the photosensor circuit 9 having the configuration shown in FIG. 7 was described as an example, but photosensor circuits 9a, 9b, and 9c that are respectively shown in FIGS. 8, 9, and 10 may also be used. Specifically, as shown in FIG. 8, in the photosensor circuit 9a, a reset wiring line 11f is arranged so as to be adjacent to the initialization wiring line 11d. The gate electrode of the photosensor element 6 is connected to the reset wiring line 11f, and the source electrode of the photosensor element 6 is connected to the initialization wiring line 11d. Therefore, the voltage of the initialization wiring line 11d and the reset wiring line 11f can be individually set, which allows for more stable operation as compared with the photosensor circuit 9. As shown in FIGS. 9 and 10, in the photosensor circuits 9b and 9c, the source of the amplifier element 7 is connected to the intersection A of the photosensor element 6 and the capacitor element 8. This allows for an accurate control when the sensitivity of the photosensor element 6 is at a sufficient level.

In the present embodiment, the configuration in which a touch position is detected by utilizing the difference in reflected light intensity, which is made by the light from the backlight 45 being reflected by the finger F on the surface of the polarizing plate 42 of the liquid crystal display device 50 was described, however, it can also be configured such that a shadow of the finger made by light from the front surface side is detected, or a light-emitting portion of a touch pen or the like, which emits light from the tip thereof, is detected.

In the present embodiment, the configuration in which the intrinsic semiconductor layer 13db of the photosensor element 6, the switching intrinsic semiconductor layer 13a, and the amplifier intrinsic semiconductor layer 13e are the amorphous silicon layer that contains the nanocrystalline silicon particles was described as an example. However, the switching intrinsic semiconductor layer 13a and the amplifier intrinsic semiconductor layer 13e may be a typical amorphous silicon layer.

In the present embodiment, the TFT substrate 20 in which an electrode of the switching element 5 that is connected to the pixel electrode 19 is used as the drain electrode was described as an example. The present invention, however, can also be applied to a TFT substrate in which an electrode of the switching element that is connected to the pixel electrode is referred to as the source electrode.

In the respective embodiments above, the TFTs were described as an example of the photosensor elements, but the present invention can also be applied to TFDs (Thin Film Diodes) and the like.

INDUSTRIAL APPLICABILITY

As described above, in the present invention, the sensitivity to infrared light of the photosensor elements that use the amorphous silicon can be improved. Therefore, the present invention is useful for a display device with a touch panel function for an outdoor use, which is likely to be affected by ambient light.

DESCRIPTION OF REFERENCE CHARACTERS

C channel region
P pixel
Sa amorphous silicon layer
Sc nanocrystalline silicon
5 switching element
6 photosensor element
7 amplifier element
9, 9a, 9b, 9c photosensor circuit
10 insulating substrate
11aa switching gate electrode
11da gate electrode
11e amplifier gate electrode
13a switching intrinsic semiconductor layer
13db intrinsic semiconductor layer
13e amplifier intrinsic semiconductor layer
14a switching extrinsic semiconductor layer
14db extrinsic semiconductor layer
14e amplifier extrinsic semiconductor layer
15a switching semiconductor layer
15db semiconductor layer
15e amplifier semiconductor layer
16aa switching source electrode
16ab switching drain electrode
16ba amplifier source electrode
16ca amplifier drain electrode
16da source electrode
16db drain electrode
20 TFT substrate
18, 29 light-shielding layer
25 liquid crystal layer (display medium layer)
30 opposite substrate
40 liquid crystal display panel

The invention claimed is:

1. A photosensor circuit comprising:
a photosensor element; and
an amplifier element that is connected to the photosensor element,
wherein the photosensor element comprises:
    a gate electrode disposed on an insulating substrate;
    a gate insulating film disposed so as to cover the gate electrode;
    a semiconductor layer disposed on the gate insulating film so as to overlap the gate electrode; and
    a source electrode and a drain electrode provided on the semiconductor layer so as to overlap the gate electrode and so as to face each other,
wherein the semiconductor layer comprises an intrinsic semiconductor layer in which a channel region is defined and an extrinsic semiconductor layer that is laminated on said intrinsic semiconductor layer such that said channel region is exposed therefrom,
wherein the intrinsic semiconductor layer is an amorphous silicon layer that contains particles of nanocrystalline silicon,
wherein the amplifier element comprises:
    an amplifier gate electrode disposed on the insulating substrate;
    the gate insulating film disposed so as to cover the amplifier gate electrode;
    an amplifier semiconductor layer disposed on the gate insulating film so as to overlap the amplifier gate electrode; and
    an amplifier source electrode and an amplifier drain electrode provided on the amplifier semiconductor layer so as to overlap the amplifier gate electrode and so as to face each other,
wherein the amplifier semiconductor layer comprises an amplifier intrinsic semiconductor layer in which a channel region is defined and an amplifier extrinsic semiconductor layer that is laminated on said amplifier intrinsic semiconductor layer such that said channel region is exposed therefrom, and
wherein the amplifier intrinsic semiconductor layer is an amorphous silicon layer that contains particles of nanocrystalline silicon.

2. A thin-film transistor substrate, comprising:
a plurality of pixels arranged in a matrix;
a plurality of switching elements respectively provided in the pixels; and
a plurality of photosensor elements respectively provided in the pixels,
wherein each of the photosensor elements comprises:
    a gate electrode disposed on an insulating substrate;
    a gate insulating film disposed so as to cover the gate electrode;
    a semiconductor layer disposed on the gate insulating film so as to overlap the gate electrode, and;
    a source electrode and a drain electrode provided on the semiconductor layer so as to overlap the gate electrode and so as to face each other,
wherein the semiconductor layer comprises an intrinsic semiconductor layer in which a channel region is defined and an extrinsic semiconductor layer that is laminated on said intrinsic semiconductor layer such that said channel region is exposed therefrom,
wherein the intrinsic semiconductor layer is an amorphous silicon layer that contains particles of nanocrystalline silicon,
wherein each of the switching elements comprises:
    a switching gate electrode disposed on the insulating substrate;
    the gate insulating film disposed so as to cover the switching gate electrode;
    a switching semiconductor layer disposed on the gate insulating film so as to overlap the switching gate electrode; and
    a switching source electrode and a switching drain electrode provided on the switching semiconductor layer so as to overlap the switching gate electrode and so as to face each other,
wherein the switching semiconductor layer comprises a switching intrinsic semiconductor layer in which a channel region is defined and a switching extrinsic semiconductor layer that is laminated on said switching intrinsic semiconductor layer such that said channel region is exposed therefrom,
wherein the switching intrinsic semiconductor layer is an amorphous silicon layer that contains particles of nanocrystalline silicon, and
wherein a light-shielding layer is provided so as to cover a respective switching element.

3. A thin-film transistor substrate, comprising:
a plurality of pixels arranged in a matrix;
a plurality of switching elements respectively provided in the pixels;
a plurality of photosensor elements respectively provided in the pixels; and
a plurality of amplifier elements respective provided in the pixels, wherein each of the photosensor elements comprises:
- a gate electrode disposed on an insulating substrate;
- a gate insulating film disposed so as to cover the gate electrode;
- a semiconductor layer disposed on the gate insulating film so as to overlap the gate electrode, and;
- a source electrode and a drain electrode provided on the semiconductor layer so as to overlap the gate electrode and so as to face each other, wherein the semiconductor layer comprises an intrinsic semiconductor layer in which a channel region is defined and an extrinsic semiconductor layer that is laminated on said intrinsic semiconductor layer such that said channel region is exposed therefrom, wherein the intrinsic semiconductor layer is an amorphous silicon layer that contains particles of nanocrystalline silicon, wherein each of the amplifier elements comprises:
- an amplifier gate electrode disposed on the insulating substrate;
- the gate insulating film disposed so as to cover the amplifier gate electrode;
- an amplifier semiconductor layer disposed on the gate insulating film so as to overlap the amplifier gate electrode; and
- an amplifier source electrode and an amplifier drain electrode provided on the amplifier semiconductor layer so as to overlap the amplifier gate electrode and so as to face each other, wherein the amplifier semiconductor layer includes an amplifier intrinsic semiconductor layer in which a channel region is defined and an amplifier extrinsic semiconductor layer that is laminated on said amplifier intrinsic semiconductor layer such that said channel region is exposed therefrom, wherein the amplifier intrinsic semiconductor layer is an amorphous silicon layer that contains particles of nanocrystalline silicon, and wherein a light-shielding layer is provided so as to cover a respective amplifier element.

* * * * *